(12) United States Patent
Yuan et al.

(10) Patent No.: US 10,141,340 B2
(45) Date of Patent: Nov. 27, 2018

(54) THIN-FILM-TRANSISTOR, THIN-FILM-TRANSISTOR ARRAY SUBSTRATE, FABRICATING METHODS THEREOF, AND DISPLAY PANEL

(71) Applicants: BOE TECHNOLOGY GROUP CO., LTD., Beijing (CN); South China University of Technology, Guangzhou (CN)

(72) Inventors: Guangcai Yuan, Beijing (CN); Liangchen Yan, Beijing (CN); Xiaoguang Xu, Beijing (CN); Lei Wang, Beijing (CN); Junbiao Peng, Beijing (CN); Linfeng Lan, Beijing (CN)

(73) Assignees: BOE TECHNOLOGY GROUP CO., LTD., Beijing (CN); SOUTH CHINA UNVIERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 15/108,678

(22) PCT Filed: Dec. 10, 2015

(86) PCT No.: PCT/CN2015/096953
§ 371 (c)(1),
(2) Date: Jun. 28, 2016

(87) PCT Pub. No.: WO2017/004939
PCT Pub. Date: Jan. 12, 2017

(65) Prior Publication Data
US 2017/0148821 A1    May 25, 2017

(30) Foreign Application Priority Data

Jul. 9, 2015 (CN) .......................... 2015 1 0400941

(51) Int. Cl.
*H01L 27/14* (2006.01)
*H01L 27/15* (2006.01)
(Continued)

(52) U.S. Cl.
CPC .... *H01L 27/1214* (2013.01); *H01L 21/28008* (2013.01); *H01L 27/1225* (2013.01);
(Continued)

(58) Field of Classification Search
CPC ............. H01L 27/1214; H01L 27/1259; H01L 29/786
(Continued)

(56) References Cited

U.S. PATENT DOCUMENTS 5,849,604 A    12/1998  Sugawara et al.
6,172,733 B1 *  1/2001  Hong .................. G02F 1/13458
                                                  349/149
(Continued)

FOREIGN PATENT DOCUMENTS

CN    1558447 B     4/2010
CN    102623510 A   8/2012
(Continued)

OTHER PUBLICATIONS

English Machine Translation Chinese Patent Application CN1558447.*
(Continued)

*Primary Examiner* — Dzung Tran
(74) *Attorney, Agent, or Firm* — Anova Law Group, PLLC

(57) ABSTRACT

In accordance with some embodiments of the disclosed subject matter, a TFT, a related TFT array substrate, fabricating methods thereof, a display panel and a display device containing the same are provided. A method for fabricating a TFT is provided, the method comprising: forming an initial conductive layer on a base substrate; performing an oxidization process to partially oxidize the initial conductive layer
(Continued)

to form an oxidized insulating sub-layer and a non-oxidized conductive sub-layer; and forming an active layer, a source electrode and a drain electrode over the oxidized insulating sub-layer.

10 Claims, 10 Drawing Sheets

(51) Int. Cl.
　　　*H01L 27/12*　　　(2006.01)
　　　*H01L 21/28*　　　(2006.01)
　　　*H01L 29/786*　　　(2006.01)
　　　*H01L 29/49*　　　(2006.01)
　　　*H01L 29/66*　　　(2006.01)

(52) U.S. Cl.
　　　CPC ...... *H01L 27/1248* (2013.01); *H01L 27/1259* (2013.01); *H01L 27/1292* (2013.01); *H01L 29/4908* (2013.01); *H01L 29/66969* (2013.01); *H01L 29/786* (2013.01); *H01L 29/7869* (2013.01)

(58) Field of Classification Search
USPC ............. 257/72, 316, 687, 79; 438/197, 266
See application file for complete search history.

(56) References Cited

U.S. PATENT DOCUMENTS

| | | | |
|---|---|---|---|
| 2002/0042167 A1* | 4/2002 | Chae | G02F 1/136286 438/149 |
| 2006/0110871 A1 | 5/2006 | Gan et al. | |
| 2007/0236641 A1* | 10/2007 | Ning | G02F 1/136286 349/147 |
| 2008/0111137 A1* | 5/2008 | Yan | H01L 29/78603 257/72 |
| 2008/0149930 A1* | 6/2008 | Lee | H01L 29/458 257/59 |
| 2009/0101903 A1* | 4/2009 | Chen | H01L 27/124 257/59 |
| 2011/0133177 A1* | 6/2011 | Suzawa | H01L 27/1225 257/43 |
| 2014/0110719 A1 | 4/2014 | Sun | |

FOREIGN PATENT DOCUMENTS

| | | |
|---|---|---|
| CN | 102629592 A | 8/2012 |
| CN | 104966674 A | 10/2015 |
| JP | 2010192501 A | 9/2010 |

\* cited by examiner

THIN-FILM-TRANSISTOR, THIN-FILM-TRANSISTOR ARRAY SUBSTRATE, FABRICATING METHODS THEREOF, AND DISPLAY PANEL

CROSS-REFERENCES TO RELATED APPLICATIONS

This PCT patent application is a national phase entry under 35 U.S.C. § 371 of International Application No. PCT/CN2015/096953, filed on Dec. 10, 2015, which claims priority of Chinese Patent Application No. 201510400941.9, filed on Jul. 9, 2015, The above enumerated patent applications are incorporated by reference herein in their entirety.

TECHNICAL FIELD

The disclosed subject matter generally relates to the display technologies and, more particularly, relates to a thin-film-transistor (TFT), a related TFT array substrate, a related fabricating method thereof, and a display panel containing the same.

BACKGROUND

Along with the development of flat panel display industry, the performance requirement of the display panel is continuously increasing. So that, there is a high requirement of the carrier mobility of the thin film transistor within the display panel.

At present, conventional thin-film-transistor (TFT) is amorphous silicon TFT, which means the active layer of the TFT is made by amorphous silicon material. Generally, the carrier mobility of the amorphous silicon thin film transistor is low. Typically, the electron mobility is between 0.1 $cm^2V^{-1}s^{-1}$ and 1 $cm^2V^{-1}s^{-1}$, which is not able to meet the current requirement of flat panel display industry. Therefore, low-temperature polysilicon (LTPS) TFT and oxide TFT are developed.

The material of the active layer of LTPS TFT is low-temperature polysilicon, which is transformed from amorphous silicon at a low temperature. LTPS TFT can have a high carrier mobility which is about 100 $cm^2V^{-1}s^{-1}$ to 500 $cm^2V^{-1}s^{-1}$. However, a serious problem of LTPS TFT is that the uniformity is not good, which blocks the application of LTPS TFT in the large-size display panel area.

On the other hand, the material of the active layer of oxide TFT is oxide semiconductor. Ensuring a good uniformity within a large size, an oxide TFT can also have a carrier mobility of 10 $cm^2V^{-1}s^{-1}$. Due to high carrier mobility, good uniformity, transparency, and simple fabricating process, the oxide TFT can meet the needs of the large-size display panel area.

In the existing production process for fabricating TFT, a sputtering method is used for forming the metal oxide semiconductor layer. Therefore, the semiconductor channel layer, the gate electrode, the source electrode and the drain electrode are all be formed in a same device, such as a sputtering device. However, because of the material of the insulating layer of oxide TFT is silicon dioxide ($SiO_2$) or silicon nitride ($SiN_x$), the insulating layer has to be formed by using plasma enhanced chemical vapor deposition (PECVD), which means a high production cost. Further, PECVD method requires a high temperature to form $SiO_2$ or $SiN_x$. Consequently, the oxide TFT cannot be formed on a flexible substrate.

Accordingly, it is desirable to provide a thin-film-transistor (TFT), a related TFT array substrates, a fabricating method thereof, and a related display panels.

BRIEF SUMMARY

In accordance with some embodiments of the disclosed subject matter, a TFT, a related TFT array substrate, fabricating methods thereof, a display panel and a display device containing the same are provided.

One aspect of the present disclosure provides a method for fabricating a TFT, the method comprising: forming an initial conductive layer on a base substrate, performing an oxidization process to partially oxidize the initial conductive layer to form an oxidized insulating sub-layer and a non-oxidized conductive sub-layer, and forming an active layer, a source electrode and a drain electrode over the oxidized insulating sub-layer.

In some embodiments, the step of forming an initial conductive layer comprises: forming a pre-plating electrode layer on the base substrate, and forming a plating electrode layer on the pre-plating electrode layer.

In some embodiments, the oxidization process converts at least a portion of the plating electrode layer into the oxidized insulating sub-layer.

In some embodiments, the non-oxidized conductive sub-layer comprises a non-oxidized portion of the plating electrode layer and the pre-plating electrode layer.

In some embodiments, the plating electrode layer is made of aluminum or aluminum alloy.

In some embodiments, the pre-plating electrode layer is formed by using at least one of: a physical vapor deposition method, a spin-coating method, a printing method, and a sol-gel method.

In some embodiments, the oxidization process comprises placing the base substrate with the initial conductive layer into an electrolyte solution to perform an oxidization treatment.

In some embodiments, the oxidization treatment comprises: connecting the initial conductive layer with an anode of a power supply, connecting the electrolyte solution with an cathode of the power supply, and applying a voltage between the anode and the cathode.

In some embodiments, the active layer is formed by using at least one of: a physical vapor deposition method, a spin-coating method, and a printing method, and the active layer is made of a metal oxide.

Another aspect of the present disclosure provides a method for fabricating a TFT array substrate, the method comprising: forming an initial conductive layer on a base substrate, wherein the initial conductive layer comprises a pre-plating electrode layer and a plating electrode layer, performing an oxidization process to partially oxidize the initial conductive layer to form an oxidized insulating sub-layer and a non-oxidized conductive sub-layer, wherein the oxidization process comprises performing an electrolytic oxidation treatment, the oxidized insulating sub-layer comprises an oxidized portion of the plating electrode layer, the non-oxidized conductive sub-layer comprises a non-oxidized portion of the plating electrode layer and the pre-plating electrode layer, and forming an active layer, a source electrode and a drain electrode over the oxidized insulating sub-layer.

In some embodiments, the method further comprises: prior to the oxidation process, forming a first oxidation preventing layer in a first preset region on the initial conductive layer, wherein the first preset region corresponds to an electrode connecting part, and removing the first oxidation preventing layer after forming the oxidized insulating sub-layer.

In some embodiments, the method further comprises: prior to the oxidation process, forming a second oxidation preventing layer in a second preset region on the initial conductive layer, wherein the second preset region corresponds to a portion of the initial conductive layer that is to be removed, and removing the second oxidation preventing layer after forming the oxidized insulating sub-layer.

In some embodiments, the first oxidation preventing layer and the second oxidation preventing layer are formed by a single patterning process.

In some embodiments, the first oxidation preventing layer and the second oxidation preventing layer are removed by a single etching process.

In some embodiments, the oxidization process comprises: placing the base substrate with the initial conductive layer into an electrolyte solution to perform an oxidization treatment, and forming an electrode connecting part located in the first preset region, wherein the electrode connecting part is a non-oxidized portion of the initial conductive layer that is covered by the first oxidation preventing layer.

In some embodiments, the method further comprises: patterning the non-oxidized conductive sub-layer and the oxidized insulating sub-layer to form an isolation region, a gate electrode region, and an electrode lead region, wherein the isolation region corresponds to the second preset region, the gate electrode region is located on a first side of the isolation region, the electrode lead region is located on a second side of the isolation region, etching a first portion the non-oxidized conductive sub-layer in the isolation region to form a gate electrode and an electrode lead, wherein the gate electrode is a second portion of the non-oxidized conductive sub-layer locating in the gate electrode region, the electrode lead is a third portion of the non-oxidized conductive sub-layer locating in the electrode lead region, the gate electrode and the electrode lead are separated by the isolation region, and electrically insulated with each other.

Another aspect of the present disclosure provides a TFT. The TFT comprises: a base substrate, a gate electrode on the based substrate, wherein the gate electrode is a first portion of an initial conductive layer that is non-oxidized, a gate insulating sub-layer on the non-oxidized gate electrode, wherein the gate insulating sub-layer is formed by oxidizing a second portion of the initial conductive layer, an active layer over the gate insulating sub-layer, and a source electrode and a drain electrode on the active layer.

In some embodiments, the initial conductive layer comprises a pre-plating electrode layer and a plating electrode layer on the pre-plating electrode layer.

In some embodiments, the gate insulating sub-layer is formed by partially oxidizing the plating electrode layer.

In some embodiments, the gate electrode comprises a first portion of the pre-plating electrode layer and a first portion of the plating electrode layer that are non-oxidized.

In some embodiments, the plating electrode layer is made by one of aluminum and aluminum alloy.

Another aspect of the present disclosure provides a TFT array substrate, incorporating an disclosed TFT.

In some embodiments, the TFT array substrate further comprises an electrode lead on the base substrate, an lead insulating sub-layer that covers the electrode lead, and an electrode connecting part that penetrates the lead insulating sub-layer and is connected with the electrode lead.

In some embodiments, the lead insulating sub-layer is formed by partially oxidizing the plating electrode layer.

In some embodiments, the lead insulating sub-layer and the gate insulating sub-layer are formed by a single oxidization process.

In some embodiments, the electrode lead is a third portion of the initial conductive layer that is non-oxidized, and the electrode lead is electrically insulated with the gate electrode.

In some embodiments, the electrode lead comprises a second portion of the pre-plating electrode layer and a second portion of the plating electrode layer that are non-oxidized.

Another aspect of the present disclosure provides a display panel, incorporating an disclosed TFT array substrate.

Another aspect of the present disclosure provides a display device, incorporating an disclosed display panel.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

FIGS. 3a-3h are schematic structural sectional views of a second exemplary TFT array substrate in accordance with some embodiments of the disclosed subject matter;

DETAILED DESCRIPTION

Figure 1:
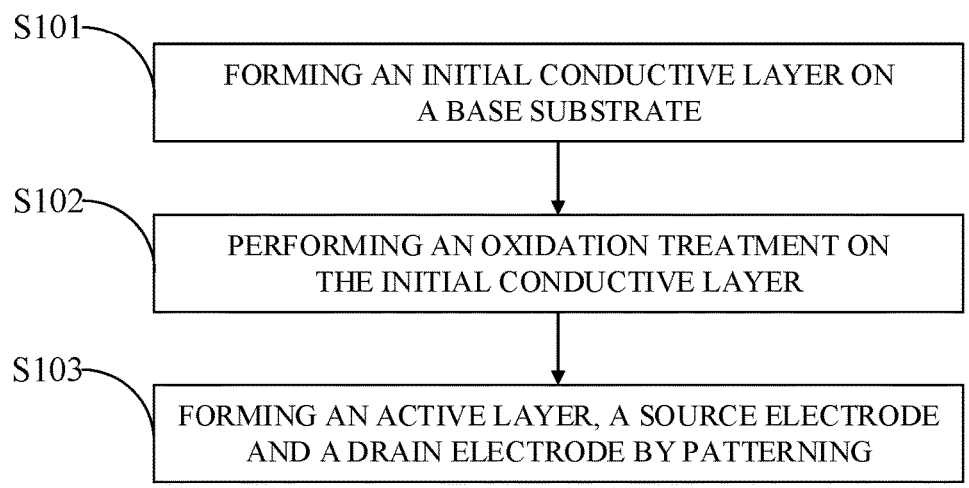
FIG. 1 shows an exemplary method for fabricating a TFT in accordance with some embodiments of the disclosed subject matter.

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

It should be noted that, the figures for each film the dimensions and shapes of each object in the drawings are not reflect the real proportion of the disclosed subject matter; rather, the dimensions and shapes are intended to illustrate only some of many possible dimensions and shapes of the disclosed subject matter.

In accordance with various embodiments, the disclosed subject matter provides a TFT, a related TFT array substrate, a fabricating method thereof, a display panel and a display device containing the same.

In accordance with various embodiments, as illustrated in FIG. 1, the disclosed subject matter provides a method for fabricating a TFT.

In some embodiments, the method can begin by forming an initial conductive layer on a base substrate at step S101. In some embodiments, the initial conductive layer has a metal material surface.

In some embodiments, the initial conductive layer includes a pre-plating electrode layer and a plating electrode layer. In some embodiments, step S101 can comprise: forming a pre-plating electrode layer above the substrate; and forming a plating electrode layer above the surface of the pre-plating electrode layer.

In some embodiments, the pre-plating electrode layer can be formed above the base substrate by using any suitable non-electroplating method, such as a physical vapor deposition method, a spin coating method, a printing method, a sol-gel method, or a magnetron sputtering method. It should be noted that, the spin coating method, the printing method, and the sol-gel method do not require a vacuum device during the process, which can reduce the production cost.

In some embodiments, the material of the pre-plating electrode layer can be any suitable conductive material, such as conductive metal material or conductive metal oxide material. In some embodiments, the thickness of the material of the pre-plating electrode layer is between 5 nm and 300 nm.

In some embodiments, the plating electrode layer can be formed above the surface of the pre-plating electrode layer by using an electroplating process. Specifically, the electroplating process can comprise: using the pre-plating electrode layer as a negative electrode; coating the plating electrode layer above the surface of the negative electrode by using electrolytic reaction. It should be noted that, the above described electroplating process does not require a vacuum device. Thus the production cost can be reduced, and the plating electrode layer prepared in favor surface oxidation treatment. Further, the formed plating electrode layer can be easily oxidized to form a oxidized insulating sub-layer.

In some embodiments, the material of the plating electrode layer can be aluminum or aluminum alloy. For example, the material of the plating electrode layer can be aluminum alloy, which may suppress the growth of hillocks during the electroplating process, and thereby ensure the uniformity of the plating electrode layer.

In some embodiments, the thickness of the plating electrode layer is between 150 nm and 600 nm.

Next, at S102, an oxidation treatment is performed on the initial conductive layer. In some embodiments, the surface of the initial conductive layer can be oxidized to form an oxidized insulating sub-layer, while a non-oxidized conductive sub-layer is the rest portion of the initial conductive layer that is not oxidized.

In some embodiments, the oxidized insulating sub-layer in TFT is formed by oxidizing the surface of the initial conductive layer, and therefore does not require a PECVD equipment. So that the disclosed method for fabricating a TFT can have reduced production cost comparing to the traditional PECVD method for forming the $SiO_2$ or SiNx insulating layer.

In some embodiments, the plating electrode layer within the initial conductive layer can either be completely oxidized, or be partially oxidized on the surface side. In some embodiments, the degree of oxidation can be determined by the need of the thickness of the oxidized insulating sub-layer, as well as the requirement of the thickness of the non-oxidized conductive sub-layer.

In some embodiments, the oxidation treatment comprises: placing a substrate with an initial conductive layer into one side of an electrolyte solution; connecting the initial conductive layer with an anode of a power supply; connecting an electrode rod with a cathode of the power supply and placing the electrode rod into the other side of the electrolyte solution; applying a suitable voltage between the anode and the cathode of the power supply; after a preset length of time, the surface of the initial conductive layer can be oxidized to form a oxidized insulating sub-layer.

In some embodiments, the voltage between the anode and the cathode, as well as the preset length of time can be determined by the characteristics of the electrolyte solution, as well as the need of oxidization degree of the initial conductive layer.

In some embodiments, the oxidation treatment is performed at room temperature, which can be well compatible with a flexible substrate. Further, because of the entire process of the oxidation treatment only requires an inexpensive DC power supply other than expensive PECVD equipment, and the electrolyte solution can be reused, the production cost of the oxidized insulating sub-layer can be dramatically reduced.

In some embodiments, the thickness of the oxidized insulating sub-layer is between 100 nm and 300 nm.

Next, at S103, an active layer, and a source electrode and a drain electrode can be formed by patterning process.

In some embodiments, in order to avoid the usage of expensive PECVD equipment, a physical vapor deposition method, a spin coating method, or a printing method can be used to form an active layer above the oxidized insulating sub-layer. In some embodiments, in order to avoid the usage of vacuum equipment, a spin coating method or a printing method can be used to form the active layer, and thereby can further reduce production cost.

In some embodiments, the material of the active layer can be any suitable metal oxide material. For example, the metal oxide material can contain at least one element of zinc, indium, gallium, and tin. In some embodiments, the thickness of the active layer is between 15 nm and 200 nm.

In some embodiments, the patterning process for forming the source electrode and the drain electrode can comprise: forming a conductive thin film above the active layer; and patterning the conductive thin film to form the source electrode and the drain electrode. In some embodiments, the source electrode and the drain electrode can be formed simultaneously by using photolithography, shielding mask method, lift-off method, or any other suitable method. In some embodiments, the thickness of the source electrode and the drain electrodes is between 100 nm and 1000 nm.

In accordance with various embodiments, the disclosed subject matter provides a method for fabricating a TFT array substrate that comprises any TFT described above.

In some embodiments, the method for fabricating a TFT array substrate shares certain steps that are also included in the method for fabricating a TFT described above in connection with FIG. 1. In the following, only those steps that are not included in the method for fabricating a TFT described above are described.

In some embodiments, above the base substrate, an electrode lead is in the same layer of the gate electrode. In some embodiments, the oxidized insulating sub-layer can include a gate insulating sub-layer and a lead insulating sub-layer. The gate insulating sub-layer covers the gate electrode, and the lead insulating sub-layer covers the electrode lead.

In some embodiments, a patterning process can be performed on the oxidized insulating sub-layer to form the gate electrode and the electrode lead, as well as the patterns of the gate insulating sub-layer and the lead insulating sub-layer which are located above the gate electrode and the electrode lead respectively.

In some embodiments, after the gate insulating sub-layer and the lead insulating sub-layer have been formed, and before the active layer is formed, a patterning process can be performed on the initial conductive layer, to form the patterns of the initial gate electrode and the initial electrode lead.

Then, an oxidation treatment can be performed on the surface of the initial gate electrode and the initial electrode lead. The surface of the initial gate electrode and the initial electrode lead can be oxidized to form the gate insulating sub-layer and the lead insulating sub-layer respectively, and the portion of the initial gate electrode that are not oxidized can form the gate electrode, while the portion of the initial electrode lead that are not oxidized can form the electrode lead.

In some embodiments, after the gate insulating sub-layer and the lead insulating sub-layer have been formed, and before the active layers is formed, a patterning process can be performed on the oxidized insulating sub-layer. Then the portions of the oxidized insulating sub-layer that correspond to the gate electrode and the electrode lead can be retained. The patterns of the gate electrode and the electrode lead, and the patterns of the portions of oxidized insulating sub-layer that are above the gate electrode and the electrode lead can be formed. In this case, the gate electrode, the electrode lead, the gate insulating sub-layer and the lead insulating sub-layer can be formed by only one time of patterning process. It can be achieved by changing one or more mask patterns, rather than by adding a fabricating process for forming the electrode lead, which reduces the process complexity, and thereby reduces the production cost.

In some embodiments, the electrode lead penetrate the oxidized insulating sub-layer through one or more contact holes. However, the oxidized insulating sub-layer is formed by oxidizing the surface of the initial conductive layer. Therefore, it is difficult to etch the one or more contact holes in the oxidized insulating sub-layer, and it is easy to etch the electrode lead during the etching process of the one or more contact holes.

Therefore, after the initial conductive layer has been formed, and before the oxidized insulating sub-layer is formed, a pattern of a first oxidation preventing layer can be formed above the initial conductive layer. In some embodiments, the pattern of the first oxidation preventing layer is in a preset region that corresponds to the electrode lead. In some embodiments, the preset region can correspond to any suitable area of the initial conductive layer that does not need to be oxidized.

In some embodiments, after the oxidized insulating sub-layer has been formed, the pattern of the first oxidation preventing layer can be removed.

In some embodiments, the first oxidation preventing layer can be used to prevent the oxidation of the surface of the initial conductive layer that is covered by the first oxidation preventing layer during the subsequent oxidation process.

In some embodiments, as covered by the first oxidation preventing layer, the preset region on the surface of the initial conductive layer that corresponds to the electrode lead cannot be oxidized during a oxidation process. Thus, electrode connecting part can be formed, which can be used for subsequent electrical connection between the electrode lead and other electrodes or signal wires. Comparing to conventional contact hole method, an etching step can be omitted, and a variety of defections during via hold process can be avoided, thereby the yield can be improved.

In the above described patterning process for forming the gate electrode and the electrode lead, it is difficult to control the etching of the oxidized insulating sub-layer, and it is also difficult to etching the gate insulating sub-layer and the lead insulating sub-layer simultaneously. Hence, after the oxidized insulating sub-layer has been patterned and before the oxidized insulating sub-layer is formed, a pattern of a second oxidation preventing layer can be formed on the initial conductive layer.

In some embodiments, the pattern of the second oxidation preventing layer can cover the regions that do not correspond to the electrode lead nor the gate electrode.

In some embodiments, the second oxidation preventing layer can be used to prevent the oxidation of the surface of the initial conductive layer that is covered by the second oxidation preventing layer during the subsequent oxidation process.

In some embodiments, after the oxidized insulating sub-layer has been formed, the pattern of the second oxidation preventing layer can be removed.

In some embodiments, the pattern of the first oxidation preventing layer and the pattern of the second oxidation preventing layer can be formed by a single patterning process. In some embodiments, the pattern of the first oxidation preventing layer and the pattern of the second oxidation preventing layer can be removed simultaneously by a single process.

In some embodiments, a base substrate that comprises an initial conductive layer, a first oxidation preventing layer, and a second oxidation preventing layer can be placed into an energized electrolyte solution to perform an oxidation treatment.

In some embodiments, the portions of the initial conductive layer that are covered by the first oxidation preventing layer and the second oxidation preventing layer cannot be oxidized, an oxidized insulating sub-layer and an electrode connecting part can then be formed. In some embodiments, the portions of the initial conductive layer that are not covered by the first oxidation preventing layer and the second oxidation preventing layer can be oxidized, to form an oxidized insulating sub-layer.

In some embodiments, a patterning process can be perform on the oxidized insulating sub-layer. Specifically, the portion of the oxidized insulating sub-layer that do not correspond to the gate electrode or the electrode lead can be removed. The portions of the oxidized insulating sub-layer that correspond to the gate electrode or the electrode lead can be retained. The pattern of gate electrode, the pattern of the electrode lead, and the patterns of the gate insulating sub-layer and the lead insulating sub-layer can be formed.

In some embodiments, in order to avoid etching the oxidized insulating sub-layer, after the initial conductive layer has been formed and before the oxidized insulating sub-layer, a patterning process can be perform on the initial conductive layer. Specifically, the regions of the initial conductive layer that correspond to the gate electrode or the electrode lead can be retained. And patterns of an initial gate electrode and an initial electrode lead can be formed. An etching process can be performed on the initial conductive layer to form patterns of the initial gate electrode and the initial electrode lead. Then an oxidation treatment can be performed on the surfaces of the initial gate electrode and the initial electrode lead. The gate electrode, the electrode lead, the gate insulating sub-layer and the lead insulating sub-layer can be formed simultaneously.

In some embodiments, after the initial conductive layer has been patterned, and before the gate insulating sub-layer and the lead insulating sub-layer are formed, a pattern of a first oxidation preventing layer can be formed above the initial conductive layer. In some embodiments, the pattern of the first oxidation preventing layer is in a region that corresponds to the initial electrode lead. In some embodiments, the first oxidation preventing layer is used to prevent the covered region from being oxidized during the subsequent oxidization process which is performed to the initial conductive layer.

In some embodiments, after the oxidized insulating sub-layer has been formed, the pattern of the first oxidation preventing layer can be removed. In some embodiments, due to the covering of the first oxidation preventing layer, the covered region on the surface of the initial conductive layer that corresponds to the initial electrode lead cannot be oxidized during the oxidation process. Thus, an electrode connecting part can be formed, which can be used for subsequent electrical connection between the electrode lead and other electrodes or signal wires. Comparing to conventional contact hole method, an etching step can be omitted, and a variety of defections during via hold process can be avoided, thereby the yield can be improved.

In some embodiments, the covered region can include any suitable area of the initial conductive layer that does not need to be oxidized.

In some embodiments, a base substrate that comprises the first oxidation preventing layer, the initial gate electrode and the initial electrode lead can be placed into an energized electrolyte solution to perform an oxidation treatment.

In some embodiments, the surface of the initial electrode lead that are covered by the first oxidation preventing layer does not be oxidized, and forms an electrode lead and an electrode connecting part. In some embodiments, the surface of the initial gate electrode that is covered by the first oxidation preventing layer does not be oxidized, and forms a gate electrode. In some embodiments, the portions that are not covered by the first oxidation preventing layer are oxidized, and form the oxidized insulating sub-layer.

In some embodiments, the patterns of the first oxidation preventing layer and/or the second oxidation preventing layer can be obtained by performing a photolithography process on the initial conductive layer. In some embodiments, the thicknesses of the first oxidation preventing layer and the second oxidation preventing layer are between 200 nm and 5000 nm.

In some embodiments, when the array substrate described above is used in a display panel, any other necessary procedures can be performed. For example, one or more pixel electrodes and/or a protective layer can be formed.

Turning to FIGS. 2a-2h, a process of a first exemplary TFT array substrate is shown in a schematic structural sectional view in accordance with some embodiments of the disclosed subject matter.

Figure 2A:
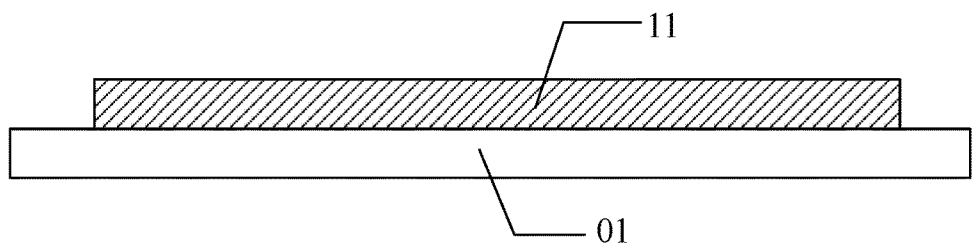
FIGS. 2a-2h are schematic structural sectional views of a first exemplary TFT array substrate in accordance with some embodiments of the disclosed subject matter.

As illustrated in FIG. 2a, pre-plating electrode layer 11 is formed above base substrate 01. In some embodiments, pre-plating electrode layer 11 can be formed by any suitable method.

For example, a pre-plating electrode film can be formed above base substrate 01 by spin coating or printing method, and a pattern of the pre-plating electrode layer can be formed by performing a photolithography process on the pre-plating electrode film. In such an example, the material of the pre-plating electrode film can be indium tin oxide (ITO), conductive silver paste, or any other suitable material. In such an example, the thickness of the pre-plating electrode film is about 100 nm.

As another example, pre-plating electrode layer 11 can be formed above a flexible base substrate by ink-jet printing method. In such an example, the material of the pre-plating electrode layer can be conductive silver paste, and the thickness of the pre-plating electrode layer is about 300 nm.

Figure 2B:
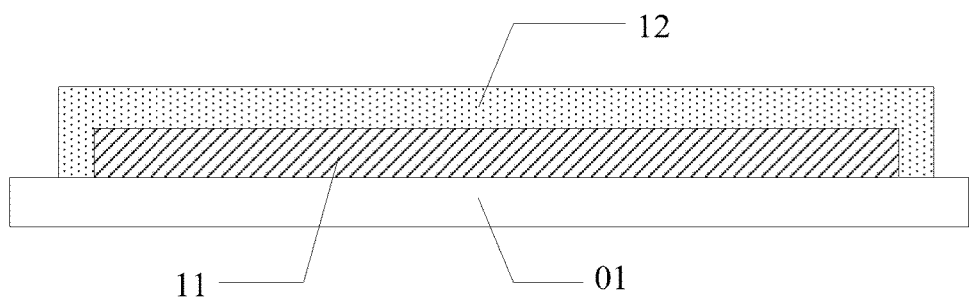

Next, as illustrated in FIG. 2b, plating electrode layer 12 is formed above pre-plating electrode layer 11. In some embodiments, plating electrode layer 12 can be formed by any suitable electroplating method.

For example, a base substrate with a pre-plating electrode layer can be placed into an aluminum chloride ($AlCl_3$) solution to perform an electroplating process, and a plating electrode layer can be formed above the surface of the pre-plating electrode layer. In such an example, the material of the plating electrode layer can be aluminum (Al), and the thickness of the plating electrode layer is about 600 nm.

In some embodiments, a plating electrode layer of alloy material can be formed above the surface of the pre-plating electrode layer by using an electroplating method. For example, the material of the plating electrode layer can be aluminum-neodymium (Al—Nd), and the thickness of the plating electrode layer is about 300 nm.

Next, a pattern of first oxidation preventing layer 13 and a pattern of second oxidation preventing layer 14 are formed above plating electrode layer 12, as illustrated in FIG. 2b.

Figure 2C:
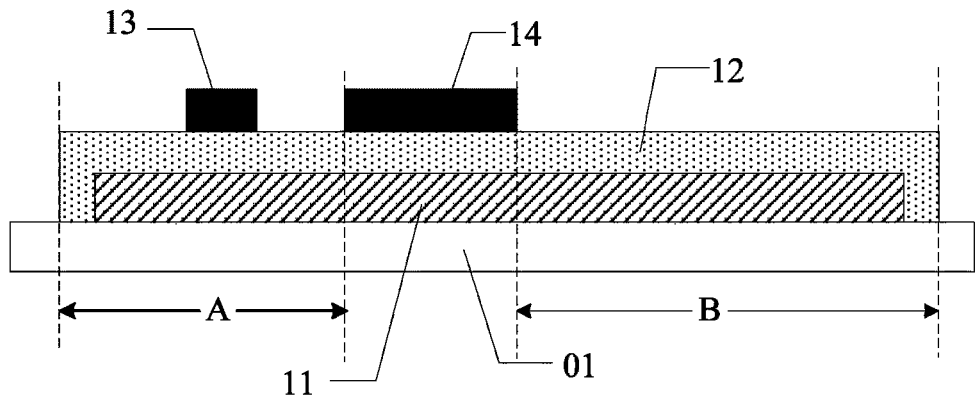

In some embodiments, the pattern of first oxidation preventing layer 13 can be formed in a preset region that is located in a first preset region as shown in FIG. 2c. The first preset region is a portion of electrode lead region A, and can correspond to an electrode connecting part. In some embodiments, the pattern of second oxidation preventing layer 14 can be formed in a second preset region. The second preset region corresponds to a portion of non-oxidized conducting sub-layer that is to be removed. The second preset region does not correspond to electrode lead region A, nor correspond to gate electrode region B.

In a specific example, a photoresist layer can be formed above plating electrode layer 12. The thickness of the photoresist layer can be around 2000 nm. A patterning process can be performed on the photoresist layer by using photolithography method. And the pattern of first oxidation preventing layer 13 and the pattern of second oxidation preventing layer 14 can be formed above plating electrode layer 12, as shown in FIG. 2c.

Figure 2D:
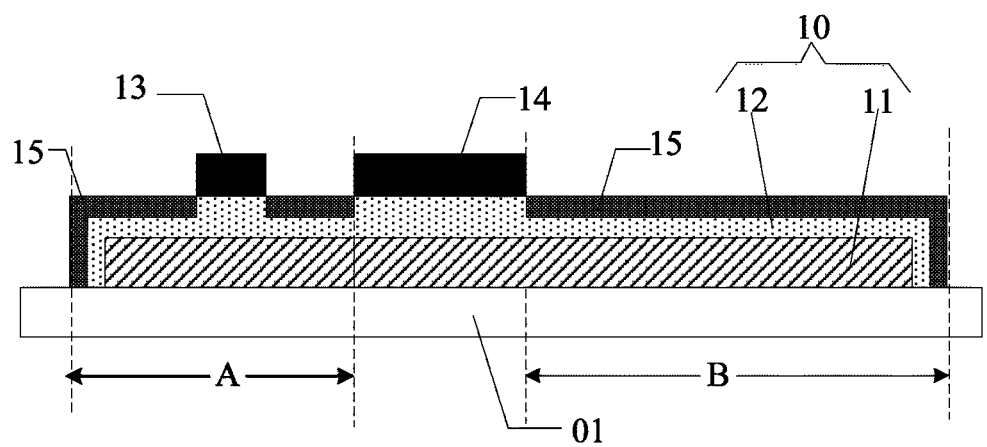

As shown in FIG. 2d, an oxidation process can be performed on the exposed surface of plating electrode layer 12. The portions of plating electrode layer 12 that have been oxidized can form oxidized insulating sub-layer 15, while the portions of plating electrode layer 12 that have not been oxidized as well as pre-plating electrode layer can form non-oxidized conducting sub-layer 10.

In some embodiments, the substrate with first oxidation preventing layer 13 and second oxidation preventing layer 14 can be placed into one side of an electrolyte solution. Plating electrode layer 12 can be connected with an anode of a power supply. A cathode of the power supply can be connected with a graphite or metal rod which is placed in the other side of the electrolyte solution. The voltage between the anode and the cathode can be increased linearly when a constant current is applied between the anode and the cathode. When the voltage reaches a preset value (e.g., 150V), a constant voltage of the preset value can be kept for 1 hour to 2 hours. After that, the substrate can be taken out, be dried by blowing nitrogen, and then be cleaned. The exposed surface of plating electrode layer 12 can form an oxide film which is used as oxidized insulating sub-layer 15. For example, the oxide film can be an aluminum oxide ($Al_2O_3$) film with a thickness of about 200 nm. In some embodiments, plating electrode layer 12 can be substantially completely oxidized to form oxidized insulating sub-layer 15 if the oxidation time is increased.

Alternatively, the cathode of the power supply can be connected with a stainless steel plate which is placed in the other side of the electrolyte solution. The voltage between the anode and the cathode can be increased linearly when a constant current density (e.g., 0.1 mA/cm$^2$) is applied between the anode and the cathode. When the voltage reaches a preset value (e.g., 100V), a constant voltage of the preset value can be kept until the current between the anode and the cathode reduced to about 0.001 mA/cm$^2$. In this way, the oxide film ($Al_2O_3$ film) can have a thickness of about 140 nm. In some embodiments, plating electrode layer 12 can be substantially completely oxidized to form oxidized insulating sub-layer 15 if the oxidation time is increased.

Figure 2E:
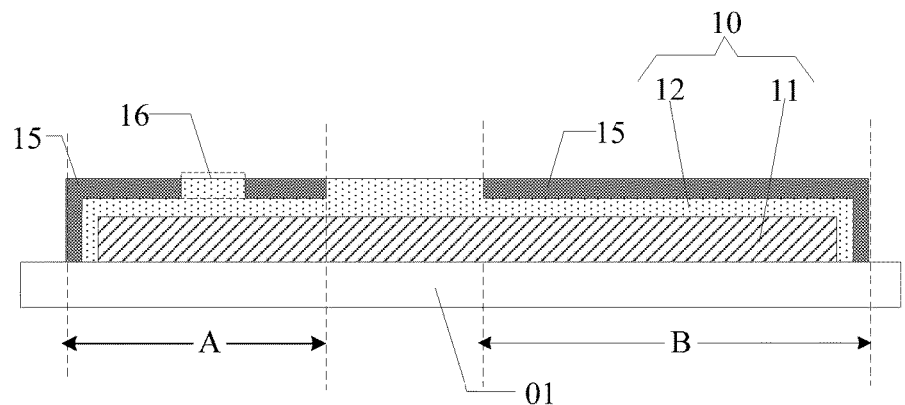

As illustrated in FIG. 2e, first oxidation preventing layer 13 and second oxidation preventing layer 14 can be removed by a single etching process. Electrode connecting part 16 can be formed in the first preset region which is shown in the dashed box in FIG. 2e. Electrode connecting part 16 is a portion of plating electrode layer 12 that is not oxidized, is located in the preset region, and has a same thickness as for the oxidized insulating sub-layer 15.

Figure 2F:
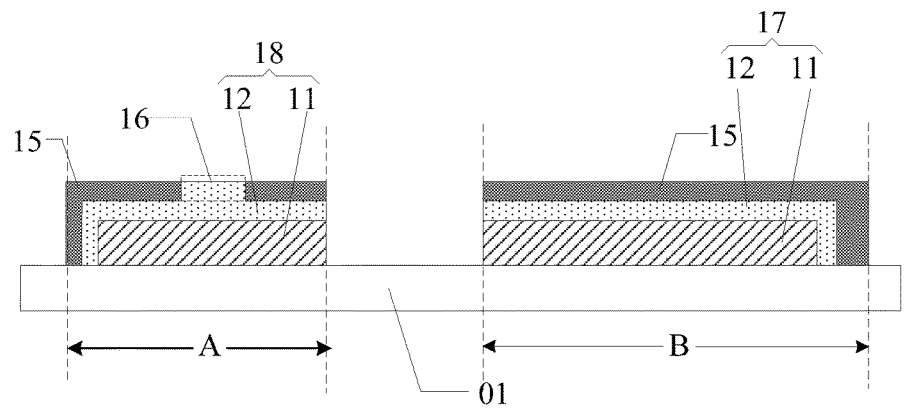

As illustrated in FIG. 2f, the portion of non-oxidized conducting sub-layer 10 that in the second preset region can be removed using a photolithography method to form the patterns of gate electrode 17, electrode lead 18, gate insulating sub-layer 15 above gate electrode 17, and lead insulating sub-layer above electrode lead 18.

Figure 2G:
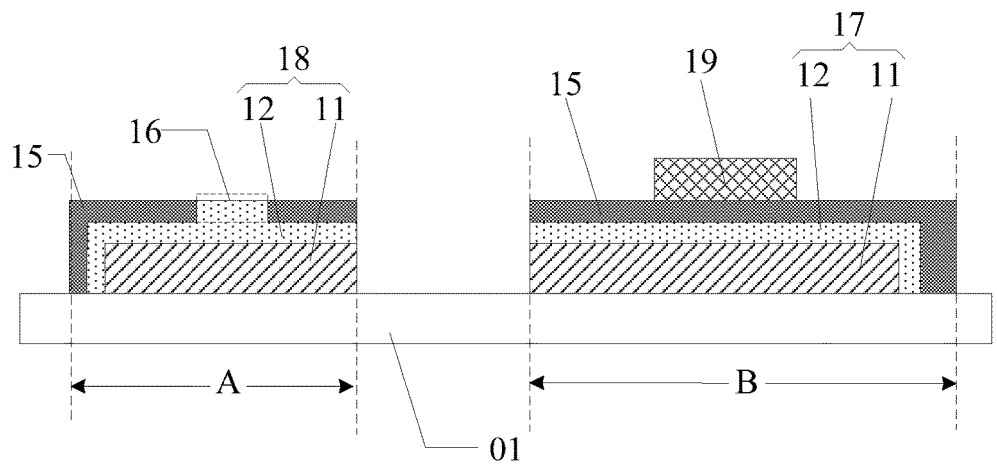

As illustrated in FIG. 2g, in gate electrode region B, a pattern of active layer 19 can be formed above gate insulating sub-layer 15, as illustrated in FIG. 2g. In some embodiments, the pattern of active layer 19 can be formed using any suitable method.

For example, a metal oxide film can be prepared above gate insulating sub-layer 15 by a spin-coating method. A thickness of the metal oxide film is about 50 nm. The pattern of active layer 19 can be formed by a photolithography process which is performed on the metal oxide film. Specifically, the material of the metal oxide film can be indium-gallium-zinc oxide (IGZO): In:Ga:Zn=1:1:1.

As another example, a metal oxide film can be prepared above gate insulating sub-layer 15 by an ink-jet printing method. A thickness of the metal oxide film is about 30 nm. The pattern of active layer 19 can be formed by a photolithography process which is performed on the metal oxide film. Specifically, the material of the metal oxide film can be indium-zinc oxide (IZO): In:Zn=1:1.

Figure 2H:
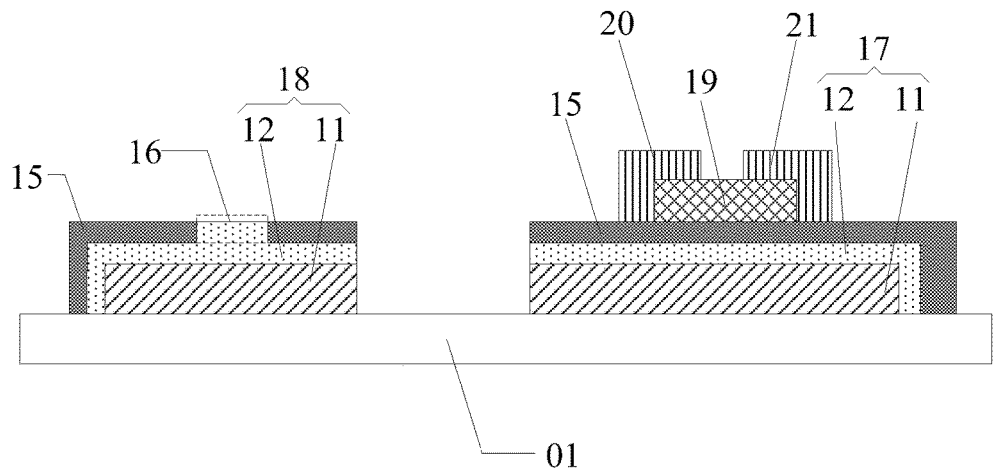

As illustrated in FIG. 2h, patterns of source electrode 20 and drain electrode 21 can be formed above active layer 19. In some embodiments, the patterns of source electrode 20 and drain electrode 21 can be formed using any suitable method.

For example, a metal oxide conductive film can be formed over active layer 19 by a spin-coating method. A thickness of the metal oxide conductive film can be 500 nm. The patterns of source electrode 20 and drain electrode 21 can be formed simultaneously by a stripping process or a photolithography process which is performed on the metal oxide conductive film. Specifically, the material of the metal oxide conductive film can be indium-tin oxide (ITO).

As another example, a metal oxide conductive film can be formed over active layer 19 by an ink-jet printing method. A thickness of the metal oxide conductive film can be 500 nm. The patterns of source electrode 20 and drain electrode 21 can be formed simultaneously by a stripping process or a photolithography process which is performed on the metal oxide conductive film. Specifically, the material of the metal oxide conductive film can be conductive silver paste.

In some embodiments, using the above described fabricating method, a formed array substrate can be shown in FIG. 2h. The array substrate can include base substrate 01, gate electrode 17, electrode lead 18, electrode connection part 16, gate insulating sub-layer and lead insulating sub-layer 15, active layer 19, source electrode 20, and drain electrode 21. In some embodiments, gate electrode 17 and electrode lead 18 can include pre-plating electrode layer 11 and a portion of plating electrode layer 12 that is not oxidized, respectively.

Without using any PECVD equipment, the above described method for fabricating an array substrate can reduce the production cost. Additionally, the above described method can be performed at a room temperature, which can be well compatible with a flexible substrate. Further, in the above described method, the active layer is formed using metal oxide material, which provides the formed TFT with many advantages, such as high carrier mobility, low preparation temperature, good uniformity, transparent to visible light, and so on.

Turning to FIGS. 3a-3h, a process of a second exemplary TFT array substrate in are shown in a schematic structural sectional view in accordance with some embodiments of the disclosed subject matter.

In some embodiments, the process can include forming pre-plating electrode layer 11 and plating electrode layer 12 as described above in connection with FIGS. 2a and 2b.

Figure 3A:
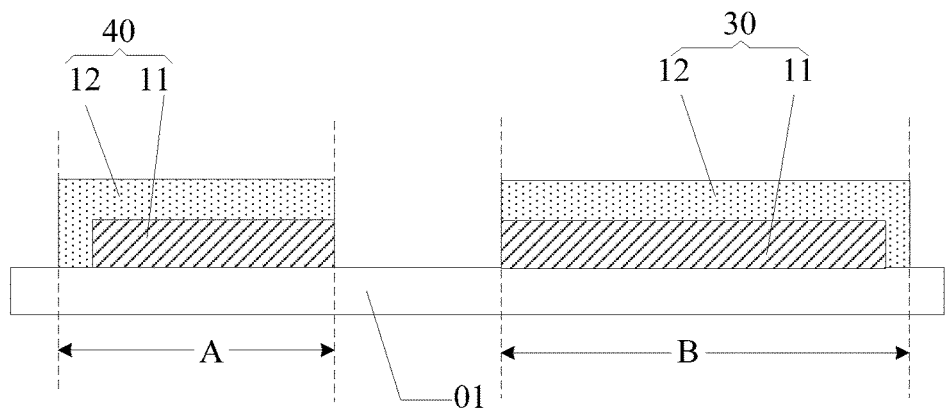

Next, as illustrated in FIG. 3a, plating electrode layer 12 and pre-plating electrode layer 11 can be patterned. The portions that correspond to electrode lead region A and gate electrode region B can be kept, and the rest portion can be removed. A pattern of initial electrode lead 40 can be formed in electrode lead region A. A pattern of initial gate electrode 30 can be formed in gate electrode region B.

Figure 3B:
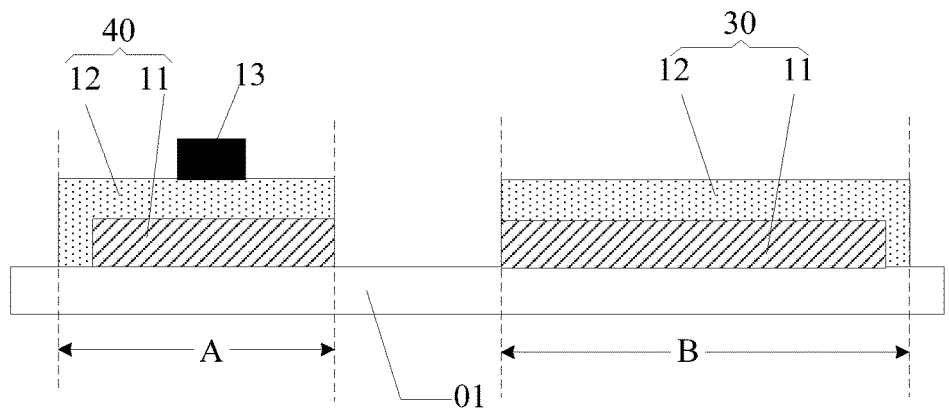

Next, as illustrated in FIG. 3b, a pattern of first oxidation preventing layer 13 can be formed in a preset region which is located above initial electrode lead 40. Specifically, a photoresist layer can be formed above plating electrode layer 12. The thickness of the photoresist layer can be around 2000 nm. A patterning process can be performed on the photoresist layer by using photolithography method. And the pattern of first oxidation preventing layer 13 can be formed in the preset region.

Figure 3C:
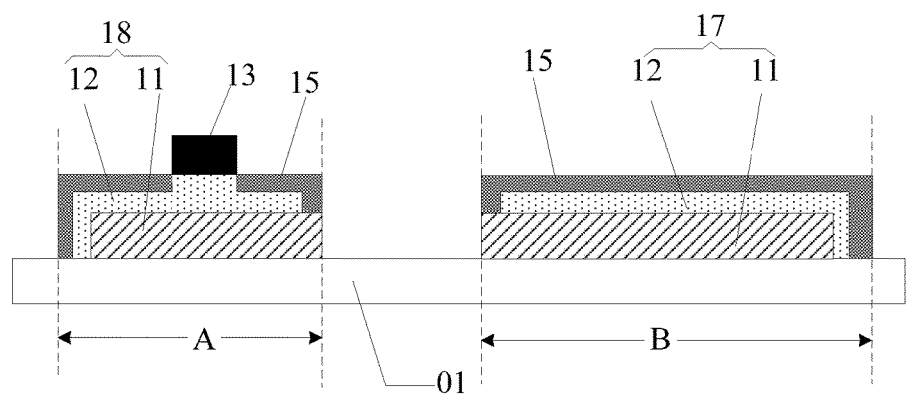

Next, as illustrated in FIG. 3c, an oxidation treatment can be performed on the exposed surface of plating electrode layer 12. The surface of plating electrode 12 can be oxidized to form oxidized insulating sub-layer 15. Corresponding to initial electrode lead 40, the portion of plating electrode layer that is not oxidized together with pre-plating electrode layer 11 can form electrode lead 18. Corresponding to initial gate electrode 30, the portion of plating electrode layer that is not oxidized together with pre-plating electrode layer 11 can form gate electrode 17. A portion of oxidized insulating sub-layer 15 above electrode lead 18 is lead insulating sub-layer, and a portion of oxidized insulating sub-layer 15 above gate electrode 17 is gate insulating sub-layer.

Specifically, the substrate with first oxidation preventing layer 13 can be placed into one side of an electrolyte solution. Plating electrode layer 12 can be connected with an anode of a power supply. A cathode of the power supply can be connected with a graphite or metal rod which is placed in the other side of the electrolyte solution. The voltage between the anode and the cathode can be increased linearly when a constant current is applied between the anode and the cathode. When the voltage reaches a preset value (e.g., 150V), a constant voltage of the preset value can be kept for 1 hour to 2 hours. After that, the substrate can be taken out, be dried by blowing nitrogen, and then be cleaned. The exposed surface of plating electrode layer 12 can form an oxide film which is used as oxidized insulating sub-layer 15. For example, the oxide film can be an aluminum oxide ($Al_2O_3$) film with a thickness of about 200 nm. In some embodiments, plating electrode layer 12 can be completely oxidized to form oxidized insulating sub-layer 15 if the oxidation time is increased.

Figure 3D:
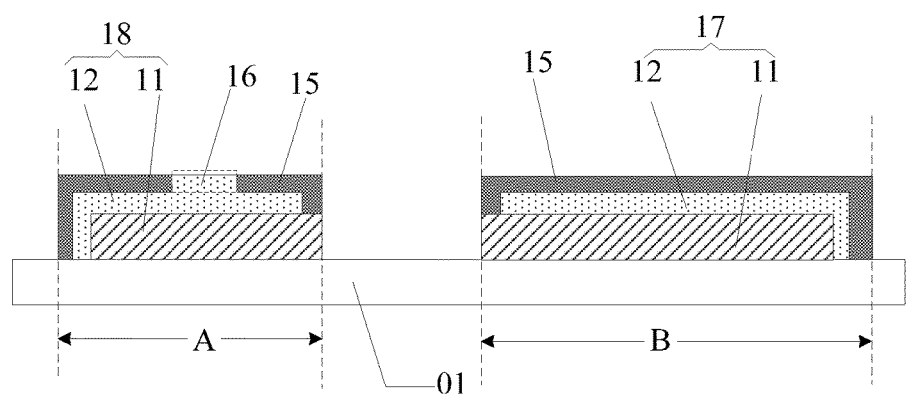

Next, as illustrated in FIG. 3d, first oxidation preventing layer 13 can be removed by a one-time etching process. Electrode connecting part 16 can be formed in the preset region. Electrode connecting part 16 is a portion of plating electrode layer 12 that is not oxidized, is located in the preset region, and has a same thickness as for the oxidized insulating sub-layer 15.

Figure 3E:
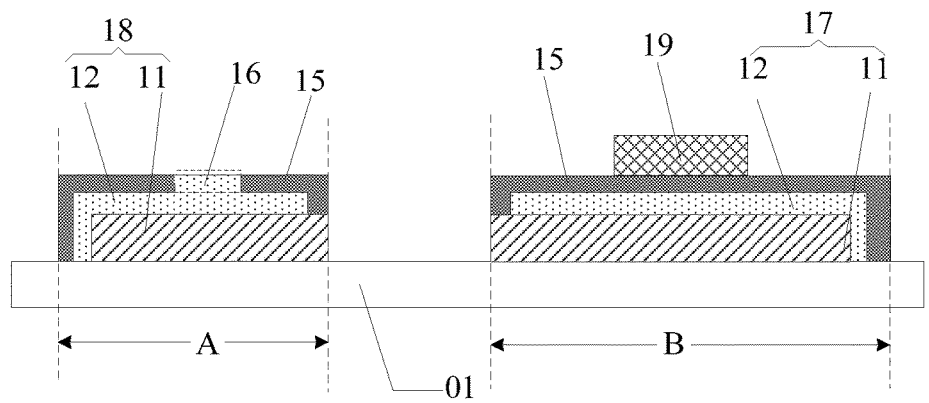

Next, as illustrated in FIG. 3e, in gate electrode region B, a pattern of active layer 19 can be formed above gate insulating sub-layer 15.

Figure 3F:
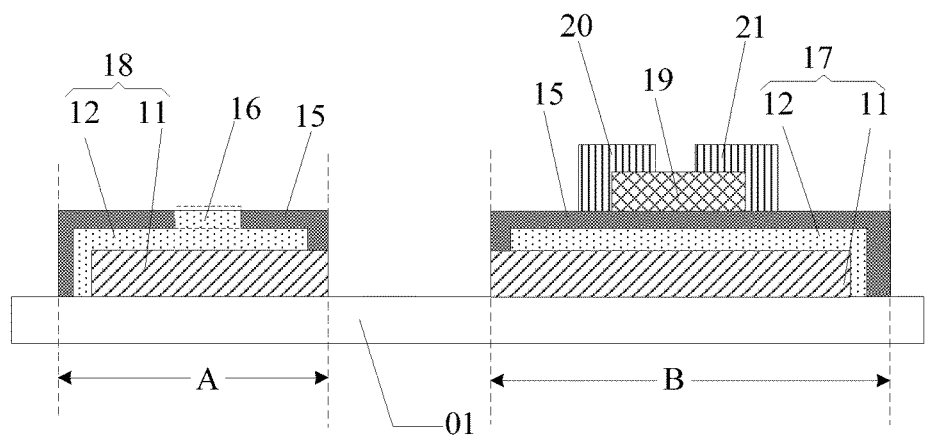

Next, as illustrated in FIG. 3f, patterns of source electrode 20 and drain electrode 21 can be formed above active layer 19. Specifically, a metal oxide conductive film can be formed over active layer 19 by a spin-coating method. A thickness of the metal oxide conductive film can be 500 nm. The patterns of source electrode 20 and drain electrode 21 can be formed simultaneously by a stripping process or a photolithography process which is performed on the metal oxide conductive film. Specifically, the material of the metal oxide conductive film can be indium-tin oxide (ITO).

In some embodiments, using the above described fabricating method, a formed array substrate can be shown in FIG. 3h. The array substrate can include base substrate 01, gate electrode 17, electrode lead 18, electrode connection part 16, gate insulating sub-layer and lead insulating sub-layer 15, active layer 19, source electrode 20, and drain electrode 21. In some embodiments, gate electrode 17 and electrode lead 18 can include pre-plating electrode layer 11 and a portion of plating electrode layer 12 that is not oxidized, respectively.

Without using any PECVD equipment, the above described method for fabricating an array substrate can reduce the production cost. Additionally, the above described method can be performed at a room temperature, which can be well compatible with a flexible substrate. Further, in the above described method, the active layer is formed using metal oxide material, which provides the formed TFT with many advantages, such as high carrier mobility, low preparation temperature, good uniformity, transparent to visible light, and so on.

Figure 4A:
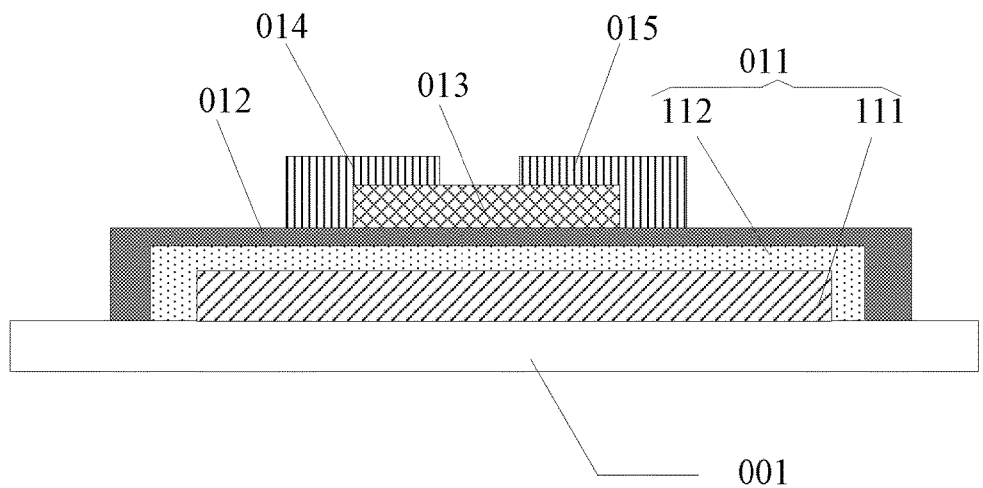
FIGS. 4a and 4b are schematic structural sectional views of two exemplary TFTs in accordance with some embodiments of the disclosed subject matter.
Figure 4B:
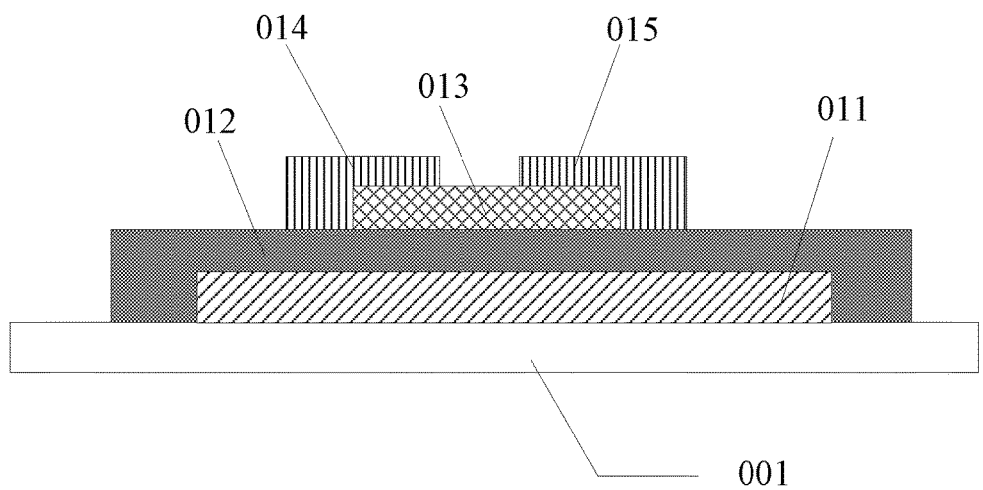

Turning to FIGS. 4a and 4b, two exemplary TFTs are shown in schematic structural sectional views in accordance with some embodiments of the disclosed subject matter. In some embodiments, each of the TFT can include base substrate 001, gate electrode 011, gate insulating sub-layer 012, active layer 013, source electrode 014, and drain electrode 015. As illustrated, gate electrode 011 is located above base substrate 001, and active layer 013 is located above gate electrode 011.

In some embodiments, gate insulating sub-layer 012 is formed by processing an oxidation treatment to the initial conductive layer, and therefore does not require a PECVD equipment. So that the disclosed method for fabricating a TFT can have reduced production cost comparing to the traditional PECVD method for forming the $SiO_2$ or SiNx insulating layer. Further, the oxidation treatment can be performed at a room temperature, which can be well compatible with a flexible substrate.

In some embodiments, as illustrated in FIG. 4a, gate electrode 011 can comprise: pre-plating gate electrode 111 and plating gate electrode 112. Plating gate electrode 112 is coated on the surface of pre-plating gate electrode 111. The material of plating gate electrode 112 is the first metal. Gate insulating sub-layer 012 is formed by a partial oxidation of the initial plating gate electrode.

In some embodiments, as illustrated in FIG. 4b, gate electrode 011 is pre-plating gate electrode. Plating gate electrode 112 is coated on the surface of pre-plating gate electrode 111. The material of the plating gate electrode 112 is the first metal. Gate insulating sub-layer 012 is formed by a complete oxidation of the initial plating gate electrode.

In some embodiments, a pre-plating gate electrode is used for forming plating gate electrode by an electroplating method. Thus the material of the pre-plating gate electrode is a conductive material, such as a conductive metal or a conductive metal oxide. A thickness of the pre-plating gate electrode is between 5 nm and 300 nm.

In some embodiments, the first metal can be aluminum or aluminum alloy. For example, the material of the plating gate electrode can be aluminum alloy, which may suppress the growth of hillocks during the electroplating process, and thereby ensure the uniformity of the plating gate electrode. A thickness of the plating gate electrode is between 150 nm and 600 nm.

In some embodiments, in order to avoid using PECVD equipment, the material of the active layer is a metal oxide material, which can contain at least one of the following element:zinc, indium, gallium, and tin. A thickness of the active layer is between 15 nm and 200 nm.

Figure 5A:
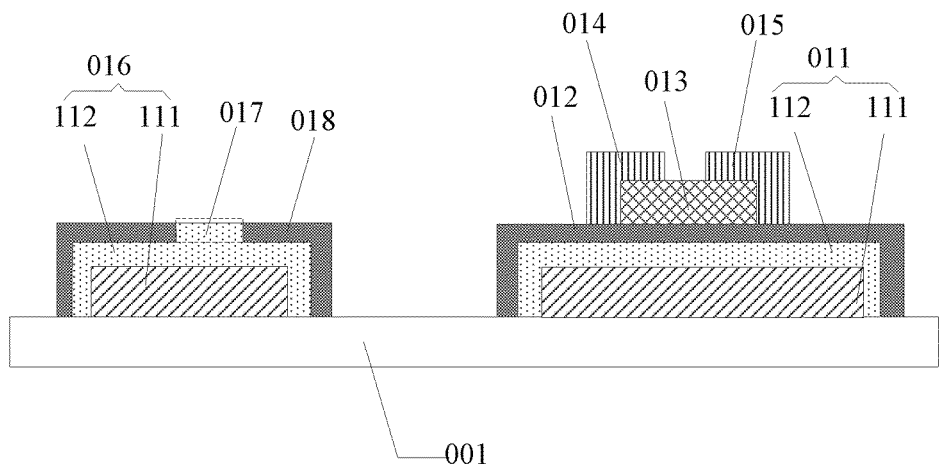
FIGS. 5a and 5b are schematic structural sectional views of two exemplary TFT array substrates in accordance with some embodiments of the disclosed subject matter.
Figure 5B:
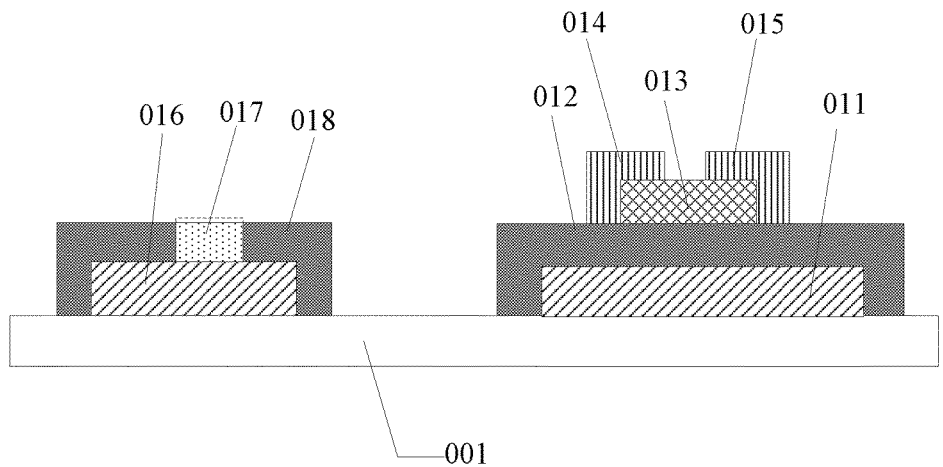

Turning to FIGS. 5a and 5b, two exemplary TFT array substrates are shown in schematic structural sectional views in accordance with some embodiments of the disclosed subject matter. In each of the TFT array substrate, oxidized insulating sub-layer is formed by processing an oxidation treatment to a first metal, and therefore does not require a PECVD equipment. The disclosed method for fabricating a TFT array substrate can have reduced production cost comparing to the traditional PECVD method for forming the $SiO_2$ or SiNx insulating layer. Further, the oxidation treatment can be performed at a room temperature, which can be well compatible with a flexible substrate.

In some embodiments, as illustrated in FIGS. 5a and 5b, each of the TFT array substrate can comprise: electrode lead 016, electrode connecting part 017, and lead insulating sub-layer 018. Electrode lead 016 is located above base substrate 001, electrode connecting part 017 is located in the preset region which is above electrode lead 016. Lead insulating sub-layer 018 is coated the portions of electrode lead 016 that is not in the preset region.

In some embodiments, the material of electrode connecting part 017 is a second metal. Lead insulating sub-layer 018 is formed by oxidizing the second metal. The thickness of lead insulating sub-layer 018 is the same as the thickness of electrode connecting part 017.

In some embodiments, the material of electrode lead is the same as the material of gate electrode. Therefore, the electrode lead and the gate electrode can be formed by a one-time patterning process, which can further reduce the production cost.

In some embodiments, the material of the first metal is the same as the second metal, and the gate insulating sub-layer and the lead insulating sub-layer is located in the same level. Therefore, the lead insulating sub-layer and the gate insulating sub-layer can be formed by a one-time patterning process, which can further reduce the production cost. The thickness of the oxidized insulating sub-layer is between 100 nm and 300 nm.

In some embodiments, as illustrated in FIG. 5a, gate electrode 011 can include pre-plating gate electrode 111 and plating gate electrode 112. Plating gate electrode 112 is coated on the surface of pre-plating gate electrode 111. Electrode connecting part 017 and electrode lead 016 are integrated into one part.

In some embodiments, as illustrated in FIG. 5b, gate electrode 011 includes pre-plating gate electrode 111. Electrode connecting part 017 is located above electrode lead 016. Electrode connecting part 017 and electrode lead 016 are not in an integrated structure.

In some embodiments, the above described TFT array substrate can be used in liquid crystal display (LCD) panel, as well as organic light emitting diode (OLED) display panel.

In some embodiments, a display panel that comprises the TFT array substrate described above can be provided. The display panel can be a liquid crystal display (LCD) panel, or an organic light emitting diode (OLED) display panel.

In some embodiments, a display device that comprises the display panel described above can be provided. The display device can be any suitable device that has a display function, such as a mobile phone, a tablet computer, a television, a monitor, a notebook computer, a digital picture frame, a navigation system, etc.

The provision of the examples described herein (as well as clauses phrased as "such as," "e.g.," "including," and the like) should not be interpreted as limiting the claimed subject matter to the specific examples; rather, the examples are intended to illustrate only some of many possible aspects. It should also be noted that the words, clauses, and/or phrased of directions and positions used herein (such as "above," "on," and the like) should not be interpreted as limiting the claimed subject matter to absolute directions or positions; rather, these are intended to illustrate only some of many possible relative directions or positions.

Accordingly, a TFT, a TFT array substrate, methods for fabricating the TFT and the TFT array substrate, a related display panel, and a related display device are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A method for fabricating a thin-film-transistor (TFT), the method comprising:

forming an initial conductive layer on a base substrate;

forming an oxidation preventing layer on a portion of the initial conductive layer to be removed;

performing an oxidization process to partially oxidize the initial conductive layer to form an oxidized insulating sub-layer and a non-oxidized conductive sub-layer, a portion of the non-oxidized conductive sub-layer being exposed through the oxidized insulating sub-layer;

removing the oxidation preventing layer after forming the oxidized insulating sub-layer;

removing, after the oxidation preventing layer is removed, the portion of the initial conductive layer to be removed to expose a portion of the base substrate; and forming an active layer, a source electrode and a drain electrode over a portion of the oxidized insulating sub-layer that is separated by the exposed portion of the base substrate from the portion of the non-oxidized conductive sub-layer exposed through the oxidized insulating sub-layer.

2. The method for fabricating the TFT of claim 1, wherein the step of forming the initial conductive layer comprises:

forming a pre-plating electrode layer on the base substrate; and forming a plating electrode layer on the pre-plating electrode layer.

3. The method for fabricating the TFT of claim 2, wherein:

the oxidization process converts at least a portion of the plating electrode layer into the oxidized insulating sub-layer; and the non-oxidized conductive sub-layer comprises a non-oxidized portion of the plating electrode layer and the pre-plating electrode layer.

4. The method for fabricating the TFT of claim 1, wherein the oxidization process comprises placing the base substrate with the initial conductive layer into an electrolyte solution to perform an oxidization treatment.

5. A method for fabricating a TFT array substrate, comprising:

forming an initial conductive layer on a base substrate, wherein the initial conductive layer comprises a pre-plating electrode layer and a plating electrode layer;

forming an oxidation preventing layer in a preset region on the initial conductive layer to be removed;

performing an oxidization process to partially oxidize the initial conductive layer to form an oxidized insulating sub-layer and a non-oxidized conductive sub-layer, wherein:

the oxidization process comprises performing an electrolytic oxidation treatment, the oxidized insulating sub-layer comprises an oxidized portion of the plating electrode layer, the non-oxidized conductive sub-layer comprises a non-oxidized portion of the plating electrode layer and the pre-plating electrode layer, and a portion of the non-oxidized conductive sub-layer is exposed through the oxidized insulating sub-layer; and removing the oxidation preventing layer after forming the oxidized insulating sub-layer;

removing, after the oxidation preventing layer is removed, the initial conductive layer in the preset region to expose a portion of the base substrate; and forming an active layer, a source electrode and a drain electrode over a portion of the oxidized insulating sub-layer that is separated by the exposed portion of the base substrate from the portion of the non-oxidized conductive sub-layer exposed through the oxidized insulating sub-layer.

6. The method for fabricating the TFT array substrate of claim 5,
wherein the oxidation preventing layer is a first oxidation preventing layer and the preset region is a first preset region,
the method further comprising:
prior to the oxidation process, forming a second oxidation preventing layer in a second preset region on the initial conductive layer, wherein the second preset region corresponds to an electrode connecting part; and
removing the second oxidation preventing layer after forming the oxidized insulating sub-layer.

7. The method for fabricating the TFT array substrate of claim 6, wherein the first oxidation preventing layer and the second oxidation preventing layer are formed by a single patterning process, and removed by a single etching process.

8. The method for fabricating the TFT array substrate of claim 6, wherein the oxidization process comprises:
placing the base substrate with the initial conductive layer into an electrolyte solution to perform an oxidization treatment; and
forming the electrode connecting part located in the second preset region;
wherein the electrode connecting part is a non-oxidized portion of the initial conductive layer that is covered by the second oxidation preventing layer.

9. The method for fabricating the TFT array substrate of claim 6, further comprising:
patterning the non-oxidized conductive sub-layer and the oxidized insulating sub-layer to form an isolation region, a gate electrode region, and an electrode lead region, wherein
the isolation region corresponds to the first preset region,
the gate electrode region is located on a first side of the isolation region, and
the electrode lead region is located on a second side of the isolation region; and
etching a first portion of the non-oxidized conductive sub-layer in the isolation region to form a gate electrode and an electrode lead, wherein:
the gate electrode is a second portion of the non-oxidized conductive sub-layer locating in the gate electrode region,
the electrode lead is a third portion of the non-oxidized conductive sub-layer locating in the electrode lead region, and
the gate electrode and the electrode lead are separated by the isolation region, and electrically insulated with each other.

10. A method for fabricating a TFT array substrate, comprising:
forming an initial conductive layer on a base substrate, wherein the initial conductive layer comprises a pre-plating electrode layer and a plating electrode layer;
forming a first oxidation preventing layer in a first preset region on the initial conductive layer, wherein the first preset region corresponds to an electrode connecting part;
forming a second oxidation preventing layer in a second preset region on the initial conductive layer, wherein the second preset region corresponds to a portion of the initial conductive layer that is to be removed;
performing, after forming the first oxidation preventing layer and the second oxidation preventing layer, an oxidization process to partially oxidize the initial conductive layer to form an oxidized insulating sub-layer and a non-oxidized conductive sub-layer, wherein:
the oxidization process comprises performing an electrolytic oxidation treatment,
the oxidized insulating sub-layer comprises an oxidized portion of the plating electrode layer, and
the non-oxidized conductive sub-layer comprises a non-oxidized portion of the plating electrode layer and the pre-plating electrode layer;
removing the first oxidation preventing layer and the second oxidation preventing layer after forming the oxidized insulating sub-layer;
removing, after the first and second oxidation preventing layers are removed, the portion of the initial conductive layer to be removed in the second preset region; and
forming an active layer, a source electrode and a drain electrode over a portion of the oxidized insulating sub-layer that is separated by the second preset region from the first preset region.

* * * * *